United States Patent
Wakiyama et al.

(10) Patent No.: US 9,941,322 B2
(45) Date of Patent: *Apr. 10, 2018

(54) THROUGH ELECTRODE OF A DEVICE SUBSTRATE

(71) Applicant: SONY CORPORATION, Tokyo (JP)

(72) Inventors: Satoru Wakiyama, Kanagawa (JP); Hiroshi Ozaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 14/919,920

(22) Filed: Oct. 22, 2015

(65) Prior Publication Data

US 2016/0043128 A1    Feb. 11, 2016

Related U.S. Application Data

(63) Continuation of application No. 13/713,398, filed on Dec. 13, 2012, now Pat. No. 9,202,941.

(30) Foreign Application Priority Data

Jan. 18, 2012    (JP) ................................ 2012-008278

(51) Int. Cl.
  *H01L 21/768* (2006.01)
  *H01L 27/146* (2006.01)
  (Continued)

(52) U.S. Cl.
  CPC .... *H01L 27/14636* (2013.01); *H01L 21/2885* (2013.01); *H01L 21/76805* (2013.01);
  (Continued)

(58) Field of Classification Search
  CPC ......... H01L 27/14636; H01L 21/76805; H01L 21/76898; H01L 23/481; H01L 23/5384
  See application file for complete search history.

(56) References Cited

U.S. PATENT DOCUMENTS 9,202,941 B2 * 12/2015 Wakiyama ........ H01L 21/76805
2010/0109164 A1   5/2010 Kang et al.
2011/0133339 A1   6/2011 Wang

FOREIGN PATENT DOCUMENTS

CN       102446933 A    5/2012
JP       2004152811 A   5/2004
(Continued)

OTHER PUBLICATIONS

Japanese Office Action dated Sep. 30, 2015 in patent application No. 2012008278.

(Continued)

*Primary Examiner* — Evan Pert
*Assistant Examiner* — Leslie Pilar Cruz
(74) *Attorney, Agent, or Firm* — Chip Law Group

(57) ABSTRACT

A semiconductor unit includes: a first device substrate including a first semiconductor substrate and a first wiring layer, in which the first wiring layer is provided on one surface side of the first semiconductor substrate; a second device substrate including a second semiconductor substrate and a second wiring layer, in which the second device substrate is bonded to the first device substrate, and the second wiring layer is provided on one surface side of the second semiconductor substrate; a through-electrode penetrating the first device substrate and a part or all of the second device substrate, and electrically connecting the first wiring layer and the second wiring layer to each other; and an insulating layer provided in opposition to the through-electrode, and penetrating one of the first semiconductor substrate and the second semiconductor substrate.

20 Claims, 13 Drawing Sheets

(51) Int. Cl.
  *H01L 31/02* (2006.01)
  *H01L 23/48* (2006.01)
  *H01L 21/288* (2006.01)
  *H01L 23/532* (2006.01)

(52) U.S. Cl.
  CPC ...... *H01L 21/76898* (2013.01); *H01L 23/481* (2013.01); *H01L 23/5329* (2013.01); *H01L 23/53209* (2013.01); *H01L 23/53228* (2013.01); *H01L 27/1469* (2013.01); *H01L 27/14632* (2013.01); *H01L 27/14634* (2013.01); *H01L 27/14687* (2013.01); *H01L 31/02005* (2013.01); *H01L 2924/0002* (2013.01)

(56) References Cited

FOREIGN PATENT DOCUMENTS

| | | |
|---|---|---|
| JP | 2010514177 A | 4/2010 |
| WO | 2011077580 A1 | 6/2011 |

OTHER PUBLICATIONS

Office Action for CN Patent Application No. 201310010898.6, dated Jul. 28, 2016, 9 pages of Office Action and 12 pages of English translation.

* cited by examiner

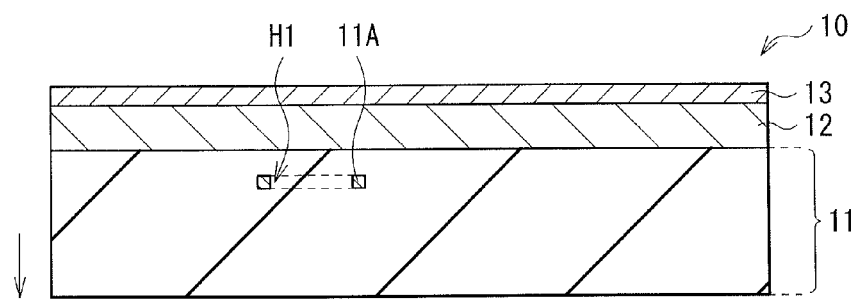
FIG. 2A
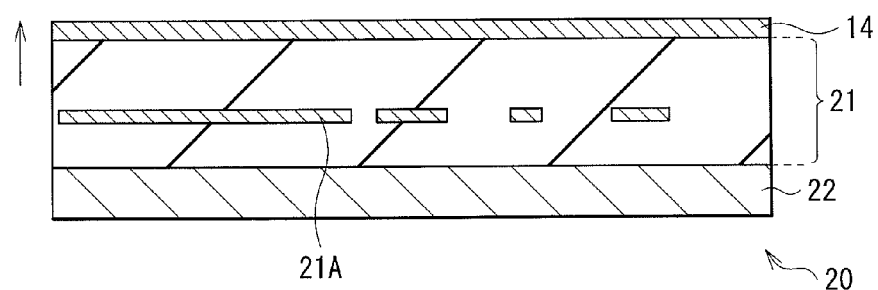
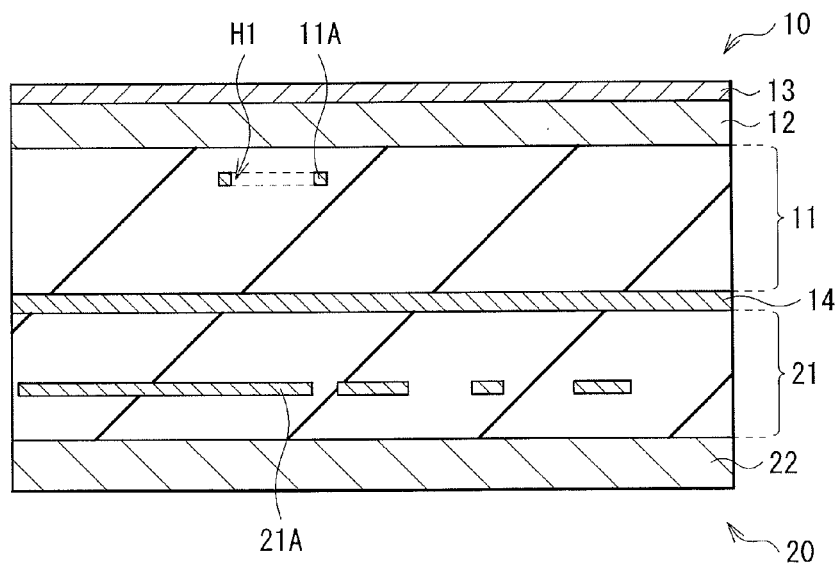
FIG. 2B

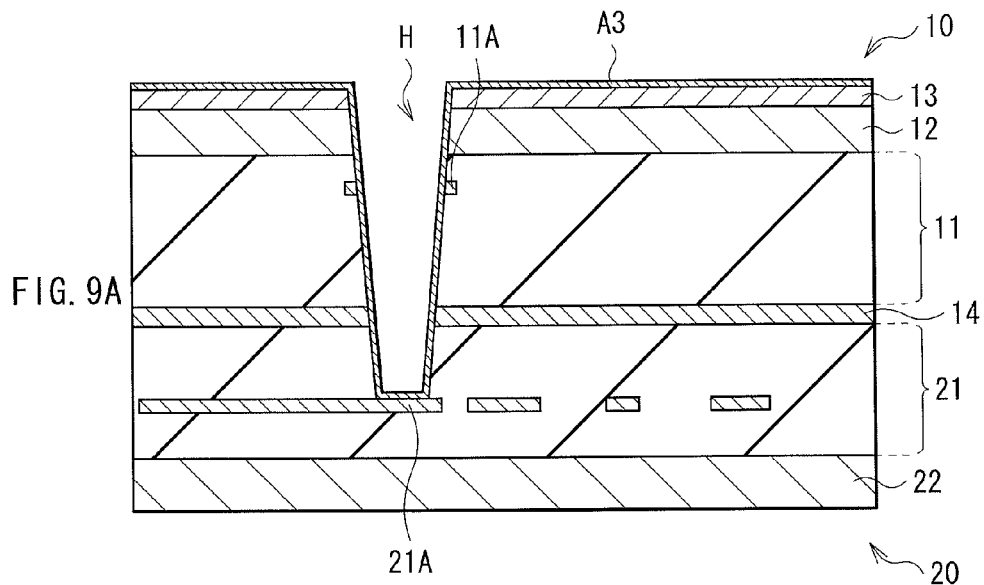
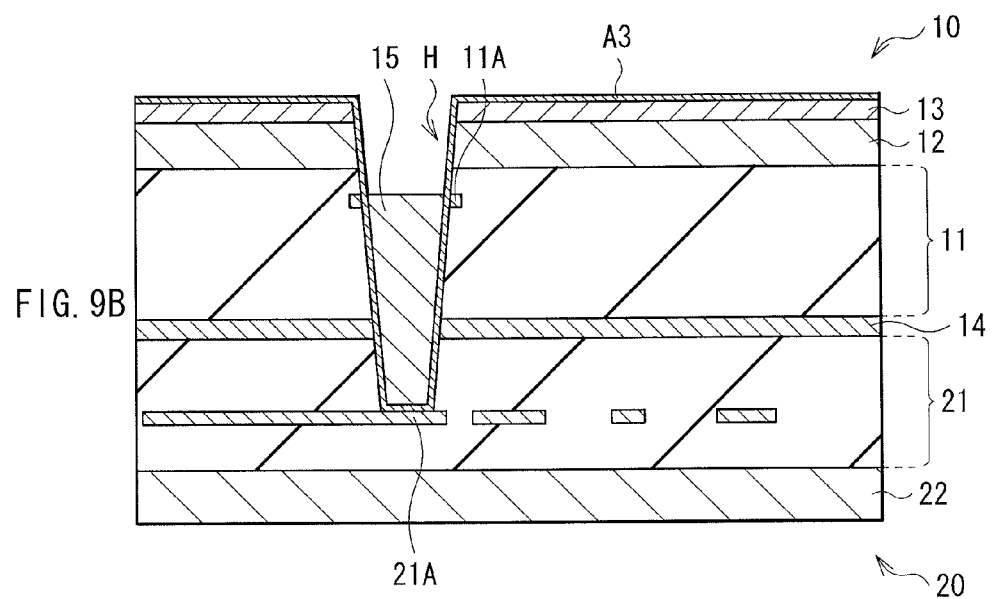

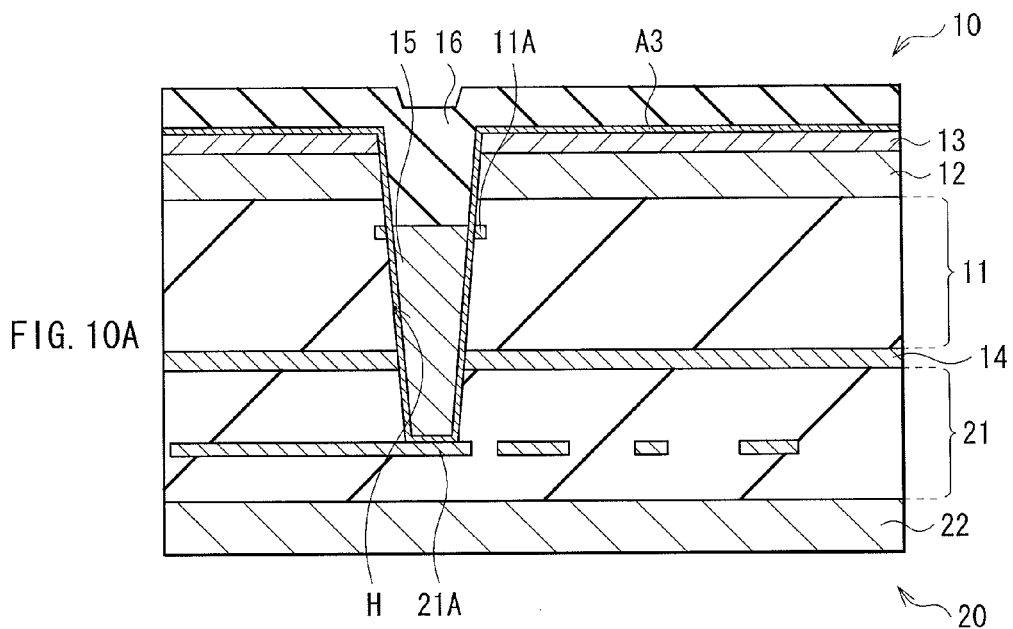
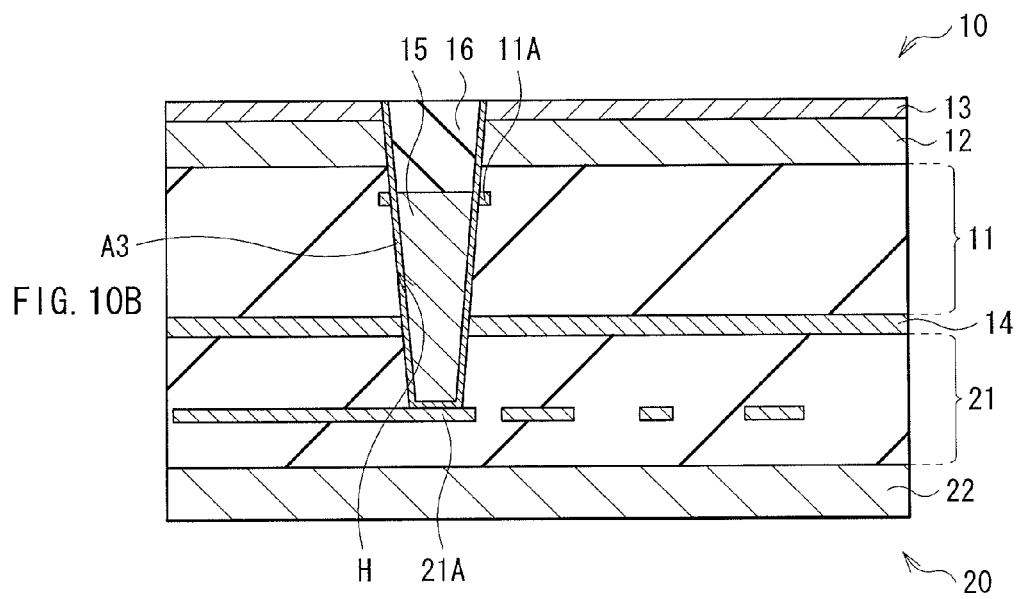

THROUGH ELECTRODE OF A DEVICE SUBSTRATE

CROSS REFERENCE TO RELATED APPLICATION

The present application is a continuation application of U.S. patent application Ser. No. 13/713,398, filed Dec. 13, 2012, which claims the benefit of priority from prior Japanese Priority Patent Application JP 2012-008278 filed in the Japan Patent Office on Jan. 18, 2012, the entire content of which is hereby incorporated by reference.

BACKGROUND

The present disclosure relates to a semiconductor unit including, for example, a plurality of types of semiconductor chips being laminated, a method of manufacturing the semiconductor unit, a solid-state image pickup unit, and an electronic apparatus.

Recently, a solid-state image pickup unit, such as a charge coupled device (CCD) or a complementary metal-oxide-semiconductor (CMOS) image sensor, has been proposed, which includes different types of semiconductor chips being laminated, for example, as disclosed in Japanese Unexamined Patent Application Publication No. 2010-245506 (JP2010-245506A). In the solid-state image pickup unit of JP2010-245506A, two types of semiconductor chips are bonded together, and connection pads provided on the chips are then electrically connected to each other with through-electrodes. Specifically, a through-electrode is provided for each pad of the chips, and an embedded interconnection is formed by a so-called damascene process for connection between such through-electrodes.

SUMMARY

In the case where chips are connected to each other with a through-electrode as described above, the through-electrode as a conductive material is formed penetrating a semiconductor substrate since each chip has a semiconductor substrate including, for example, silicon. As a result, it is difficult to ensure insulation between the through-electrode and the semiconductor substrates. In addition, the height (length) of the through-electrode itself increases, leading to an increase in wiring capacitance. It is therefore desired to achieve a semiconductor unit allowing excellent electrical connection to be ensured between device substrates such as semiconductor chips or wafers.

It is desirable to provide a semiconductor unit allowing excellent electrical connection to be ensured between different device substrates, a method of manufacturing the semiconductor unit, a solid-state image pickup unit, and an electronic apparatus.

A semiconductor unit according to an embodiment of the disclosure includes: a first device substrate including a first semiconductor substrate and a first wiring layer, the first wiring layer being provided on one surface side of the first semiconductor substrate; a second device substrate including a second semiconductor substrate and a second wiring layer, the second device substrate being bonded to the first device substrate, and the second wiring layer being provided on one surface side of the second semiconductor substrate; a through-electrode penetrating the first device substrate and a part or all of the second device substrate, and electrically connecting the first wiring layer and the second wiring layer to each other; and an insulating layer provided in opposition to the through-electrode, and penetrating one of the first semiconductor substrate and the second semiconductor substrate.

A method of manufacturing a semiconductor unit according to an embodiment of the disclosure includes: bonding a first device substrate to a second device substrate, the first device substrate including a first semiconductor substrate and a first wiring layer, the first wiring layer being provided on one surface side of the first semiconductor substrate, the second device substrate including a second semiconductor substrate and a second wiring layer, and the second wiring layer being provided on one surface side of the second semiconductor substrate; forming a through-electrode, the through-electrode penetrating the first device substrate and a part or all of the second device substrate and electrically connecting the first wiring layer and the second wiring layer to each other; and forming an insulating layer, the insulating layer being formed in opposition to the through-electrode and penetrating one of the first semiconductor substrate and the second semiconductor substrate.

In the semiconductor unit and the method of manufacturing the semiconductor unit according to the above-described respective embodiments of the disclosure, the first and second device substrates are bonded to each other, in which the first and second wiring layers are electrically connected to each other by the through-electrode, and the insulating layer is provided penetrating one of the first and second semiconductor substrates. This makes it easier to ensure insulation between the semiconductor substrate and the through-electrode. In addition, a wiring distance between the first and second wiring layers is reduced, leading to a reduction in wiring capacitance.

A solid-state image pickup unit according to an embodiment of the disclosure is provided with a semiconductor unit. The semiconductor unit includes: a first device substrate including a first semiconductor substrate and a first wiring layer, the first wiring layer being provided on one surface side of the first semiconductor substrate; a second device substrate including a second semiconductor substrate and a second wiring layer, the second device substrate being bonded to the first device substrate, and the second wiring layer being provided on one surface side of the second semiconductor substrate; a through-electrode penetrating the first device substrate and a part or all of the second device substrate, and electrically connecting the first wiring layer and the second wiring layer to each other; and an insulating layer provided in opposition to the through-electrode, and penetrating one of the first semiconductor substrate and the second semiconductor substrate.

An electronic apparatus according to an embodiment of the disclosure is provided with a solid-state image pickup unit. The solid-state image pickup unit is provided with a semiconductor unit. The semiconductor unit includes: a first device substrate including a first semiconductor substrate and a first wiring layer, the first wiring layer being provided on one surface side of the first semiconductor substrate; a second device substrate including a second semiconductor substrate and a second wiring layer, the second device substrate being bonded to the first device substrate, and the second wiring layer being provided on one surface side of the second semiconductor substrate; a through-electrode penetrating the first device substrate and a part or all of the second device substrate, and electrically connecting the first wiring layer and the second wiring layer to each other; and an insulating layer provided in opposition to the through-electrode, and penetrating one of the first semiconductor substrate and the second semiconductor substrate.

According to the semiconductor unit and the method of manufacturing the semiconductor unit of the above-described respective embodiments of the disclosure, the first and second semiconductor substrates are bonded to each other, in which the first and second wiring layers are electrically connected to each other by the through-electrode, and the insulating layer is provided penetrating one of the first and second semiconductor substrates. As a result, while insulation between the semiconductor substrate and the through-electrode is ensured, the wiring capacitance between the first and second wiring layers is reduced. Consequently, excellent electrical connection is ensured between different device substrates.

The solid-state image pickup unit and the electronic apparatus according to the above-described respective embodiments of the disclosure each include the semiconductor unit according to the above-described embodiment of the disclosure. As a result, while insulation between the semiconductor substrate and the through-electrode is ensured, the wiring capacitance between the first and second wiring layers is reduced. Consequently, excellent electrical connection is established between different device substrates.

It is to be understood that both the foregoing general description and the following detailed description are exemplary, and are intended to provide further explanation of the technology as claimed

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 2A and 2B are sectional views for describing a method of manufacturing the semiconductor unit illustrated in FIG. 1.

FIGS. 9A and 9B are sectional views for describing a method of manufacturing the semiconductor unit illustrated in FIG. 8.

FIGS. 10A and 10B are sectional views illustrating steps following the steps of FIGS. 9A and 9B.

DETAILED DESCRIPTION OF EMBODIMENT

Hereinafter, some embodiments of the disclosure will be described in detail with reference to the accompanying drawings. It is to be noted that description is made in the following order.

1. First embodiment (Example of semiconductor unit with through-electrode formed by electroless plating).
2. Second embodiment (Example of semiconductor unit with through-electrode formed by electrolytic plating (time control)).
3. Third embodiment (Example of semiconductor unit with through-electrode formed by electrolytic plating (etching after plating)).
4. Application example 1 (Example of solid-state image pickup unit).
5. Application example 2 (Example of electronic apparatus (camera)).

First Embodiment

Configuration

Figure 1:
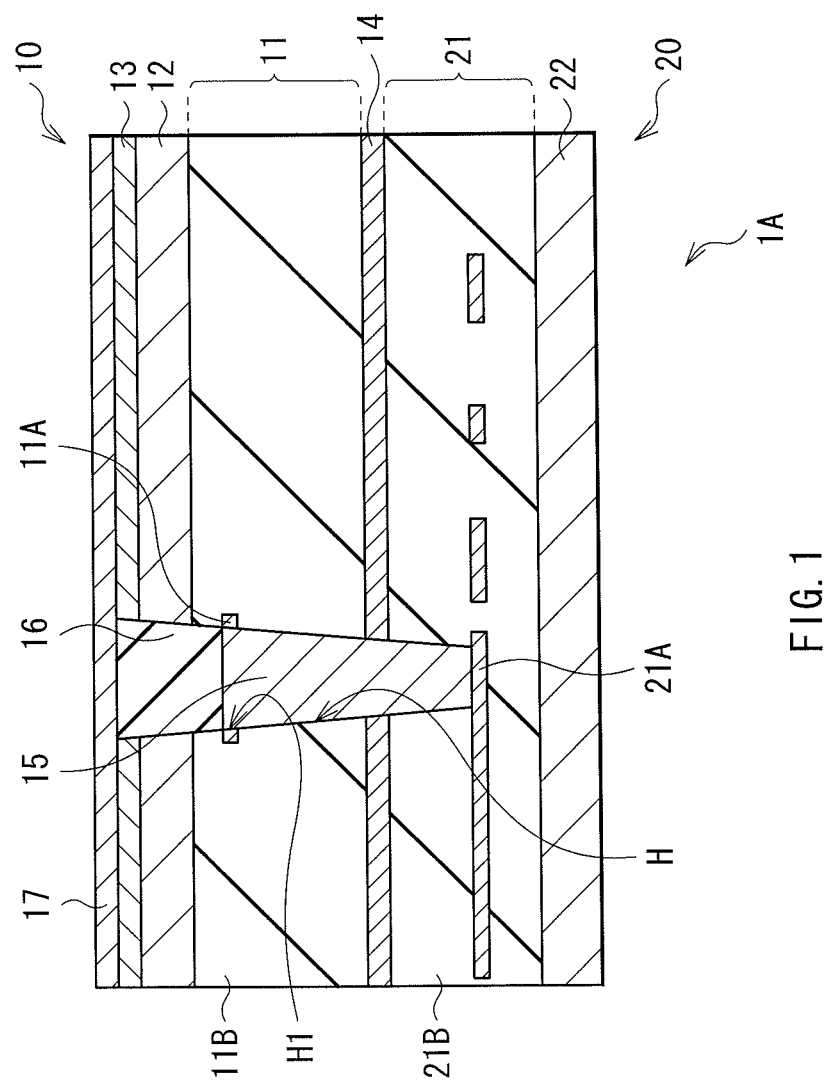
FIG. 1 is a sectional view illustrating a schematic configuration of a semiconductor unit according to a first embodiment of the disclosure.

FIG. 1 illustrates a sectional configuration of a semiconductor unit (semiconductor unit 1A) according to a first embodiment of the disclosure. The semiconductor unit 1A, which is used in, for example, a solid-state image pickup unit 1 described later, includes two different types of semiconductor chips (a first chip 10 and a second chip 20) bonded to each other. The first chip 10 has a plurality of pixels each including, for example, an organic photoelectric conversion device, and the second chip 20 has a peripheral circuit to drive the pixels, as described in detail later. It is to be noted that the first chip 10 and the second chip 20 correspond to "first device substrate" and "second device substrate", respectively, in one embodiment of the disclosure without limitation.

The first chip 10 includes a semiconductor substrate 12 including a multilayer wiring layer 11 on one surface of the substrate 12, and including a device formation layer 13, having a pixel section 10A described later, on the other surface thereof. The second chip 20 also includes a semiconductor substrate 22 including a multilayer wiring layer 21 on one surface of the substrate 22, and including, for example, a circuit section 130 (not illustrated in FIG. 1) described later on the other surface thereof. For example, the first chip 10 and the second chip 20 are bonded to each other such that the multilayer wiring layers 11 and 21 face each other, for example, with an adhesive layer 14 therebetween.

Each of the semiconductor substrates 12 and 22 is formed of, for example, silicon (Si). The semiconductor substrate, however, may be formed of glass, plastic, or a metal sheet having an insulated surface depending on applications of the semiconductor unit 1A.

The multilayer wiring layers 11 and 21 are each configured of a plurality of wiring layers, each including, for example, copper (Cu) or aluminum (Al), provided with interlayer insulating films 11B and 21B, respectively, therebetween. The interlayer insulating films 11B and 21B are each configured of laminated films such as silicon compound films including, for example, silicon dioxide ($SiO_2$), silicon nitride (SiN), and silicon oxynitride (SiON).

The multilayer wiring layers 11 and 21 have pads (a first connection pad 11A and a second connection pad 21A, respectively) for electrical connection between the first and second chips 10 and 20. It is to be noted that the first connection pad 11A and the second connection pad 21A correspond to specific but not limitative examples of "first wiring layer" and "second wiring layer", respectively, in one embodiment of the disclosure. The first connection pad 11A and the second connection pad 21A are electrically connected to each other by a through-electrode 15 provided penetrating the first chip 10 and penetrating part or all of the second chip 20. In detail, a through-hole H is provided from the surface of the first chip 10 up to the surface of the second connection pad 21A through the device formation layer 13, the semiconductor substrate 12, and the multilayer wiring layer 11 (the first connection pad 11A). A region between the first connection pad 11A and the second connection pad 21A in the through-hole H is filled with a conductive film, resulting in formation of the through-electrode 15.

The first connection pad 11A and the second connection pad 21A, each including, for example, copper or aluminum, are provided at positions opposed to each other. The first connection pad 11A has an opening H1 as a part of the through-hole H. The opening H1 is filled with a conductive film as the through-electrode 15 for connection to the second connection pad 21A.

The through-electrode 15 is formed of, for example, copper or nickel (Ni). In the first embodiment, the through-electrode 15 is formed by electroless plating, as described in detail later. The through-electrode 15 has a height (thickness, or wiring distance) of about 3 μm to 15 μm, for example. It is to be noted that the semiconductor unit 1A may have one through-electrode 15, or two or more through-electrodes 15.

In the first embodiment, an insulating film 16 is further provided on the through-electrode 15 in the through-hole H. In other words, the insulating film 16 is so provided as to fill the upper part (corresponding to a region penetrating the semiconductor substrate 12) of the through-hole H.

The insulating film 16 is formed of a highly heat-resistant insulating material, for example, silicon oxide such as silicon dioxide and silicon oxynitride, or a photosensitive resin such as benzocyclobutene (BCB) resin and polyimide. The surface of the insulating film 16 is coplanar with the surface of the first chip 10 (the surface of the device formation layer 13), and a protective film 17 is so provided as to cover the insulating film 16 and the device formation layer 13.

The protective film 17 is a monolayer film including, for example, one of silicon dioxide, silicon nitride, and aluminum oxide, or a multilayer film including two or more of them.

[Manufacturing Method]

The semiconductor unit 1A is manufactured in the following way, for example. FIGS. 2A to 5B illustrate a method of manufacturing the semiconductor unit 1A in process sequence.

First, as illustrated in FIGS. 2A and 2B, the first and second chips 10 and 20 are disposed to be opposed to each other such that the multilayer wiring layers 11 and 21 face each other, and are bonded to each other with the adhesive layer 14 therebetween. It is to be noted that the first chip 10 includes the multilayer wiring layer 11 in which an opening H1 is beforehand formed in the first connection pad 11A. The first and second chips 10 and 20 may be bonded to each other, for example, with surface activation treatment instead of the adhesive layer 14.

Figure 3:
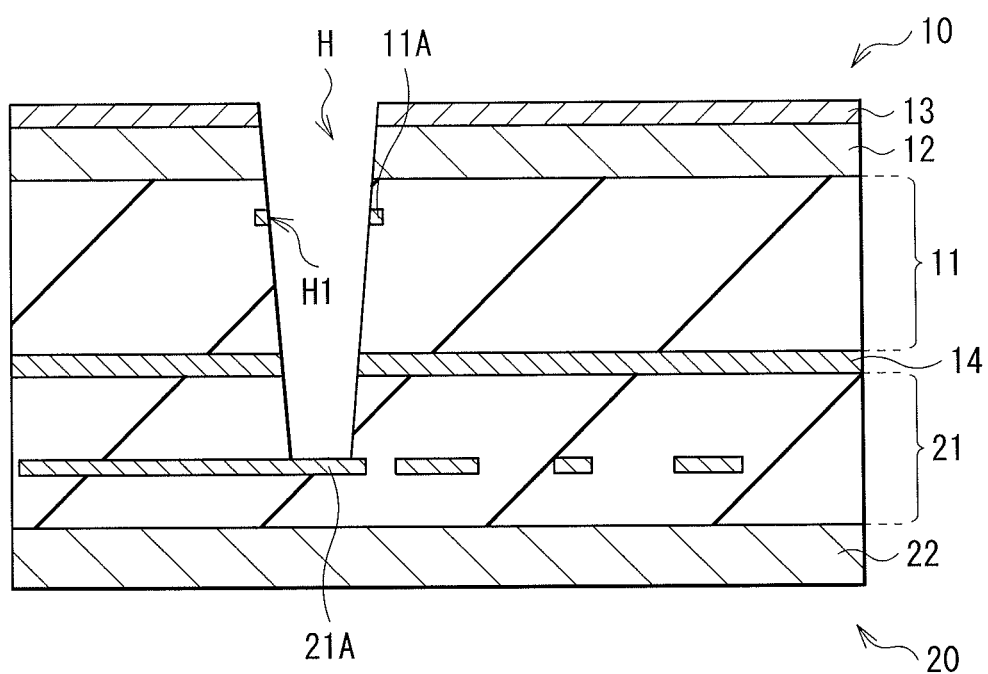
FIG. 3 is a sectional view illustrating a step following the steps of FIGS. 2A and 2B.

Then, as illustrated in FIG. 3, the through-hole H is formed. Specifically, part of a region opposed to each of the first connection pad 11A (in detail, the opening H1) and the second connection pad 21A is selectively removed by dry etching using a photolithography process, for example. Consequently, the device formation layer 13, the semiconductor substrate 12, the multilayer wiring layer 11, the adhesive layer 14, an interlayer insulating film 21B of the multilayer wiring layer 21 are each partially removed to expose the inner wall (opening H1) of the first connection pad 11A and the surface of the second connection pad 21A.

Figure 4A:
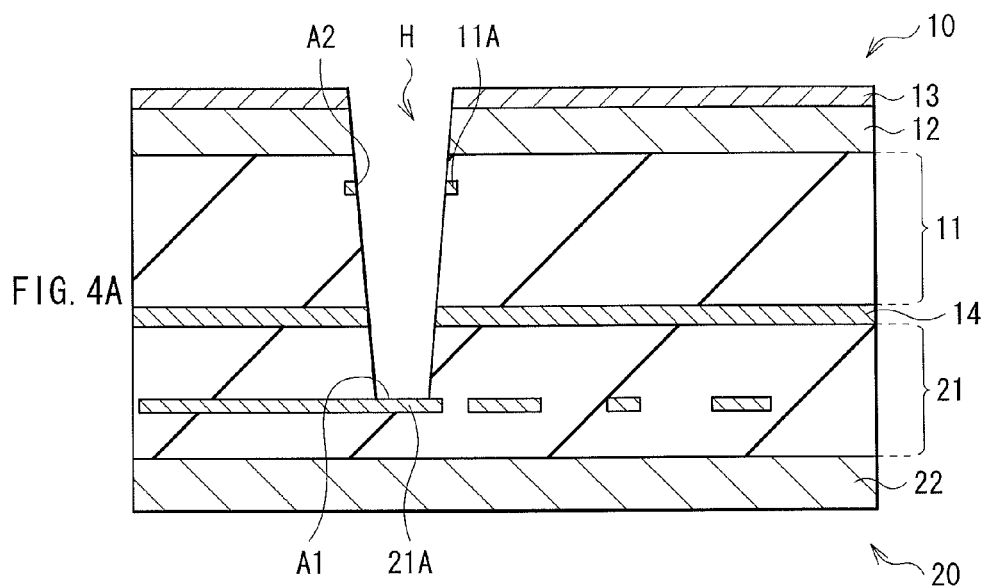
FIGS. 4A and 4B are sectional views illustrating steps following the step of FIG. 3.

Then, as illustrated in FIG. 4A, displacement treatment is performed to (displacement coatings A1 and A2 are formed on) each of the surface of the second connection pad 21A and the inner wall surface of the opening H1 of the first connection pad 11A, the surfaces being exposed in the through-hole H, as pretreatment for electroless plating described below. In this operation, for example, zinc (Zn) is used for the displacement treatment for electroless Ni plating, and, for example, palladium (Pd) is used for the displacement treatment for electroless Cu plating.

Figure 4B:
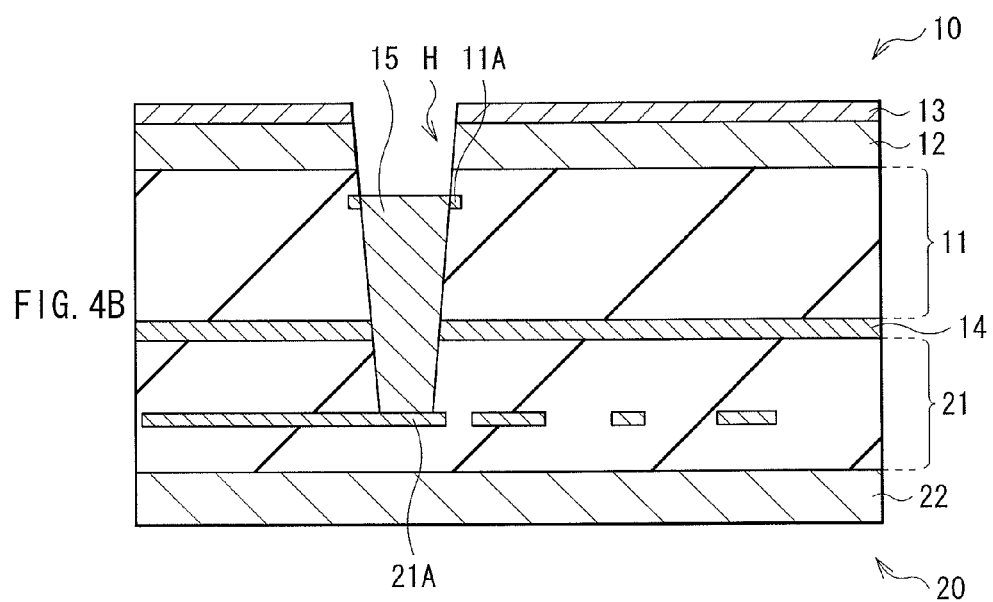

Then, as illustrated in FIG. 4B, for example, a plated nickel or copper film is precipitated in the through-hole H through electroless Ni or Cu plating to form the through-electrode 15, i.e., the first connection pad 11A is electrically connected to the second connection pad 21A. In this operation, for the electroless Ni plating, a formaldehyde-based plating solution is applied to fill the through-hole H. For the electroless Cu plating, a sulfonic acid-based plating solution may be used in the same way. In this operation, the plated film precipitates (grows) from both the displacement coatings A1 and A2, and the growth rate from each of the displacement coatings A1 and A2 is determined based on the area of each of the displacement coatings A1 and A2. An area ratio between the displacement coatings A1 and A2 may be therefore appropriately set depending on, for example, an aspect ratio of the through-hole H. This prevents the opening H1 from being closed before the first and second connection pads 11A and 21A are connected to each other. For example, if the opening H has a large aspect ratio (i.e., width<depth), for example, the area of the displacement coating A1 may be set larger than that of the displacement coating A2. This advances upward growth of the plating from the displacement coating A1. As a result, the first and second connection pads 11A and 21A are connected to each other before closing of the opening H1.

Figure 5A:
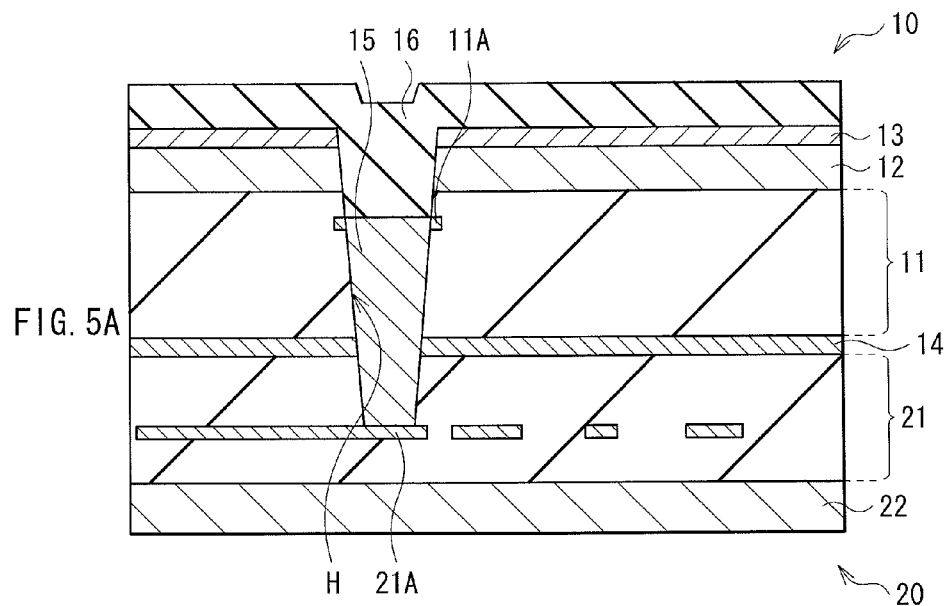
FIGS. 5A and 5B are sectional views illustrating steps following the steps of FIGS. 4A and 4B.

Then, the insulating layer 16 is formed. Specifically, first, as illustrated in FIG. 5A, the above-described insulating material is formed over the entire surface of the first chip 10 in such a manner as to fill the region on the through-electrode 15 in the through-hole H. For example, spin on glass (SOG) is formed, for example, by spin coating, and is cured, for example, at a temperature of about 600° C. to form a silicon oxide ($SiO_2$) film. Alternatively, the photosensitive resin such as benzocyclobutene (BCB) resin or polyimide may be formed by spin coating, for example. Furthermore, any one of the above-described silicon compounds may be deposited by a plasma chemical-vapor-deposition (CVD) process or a high-density plasma CVD (HDP-CVD) process, for example.

Figure 5B:
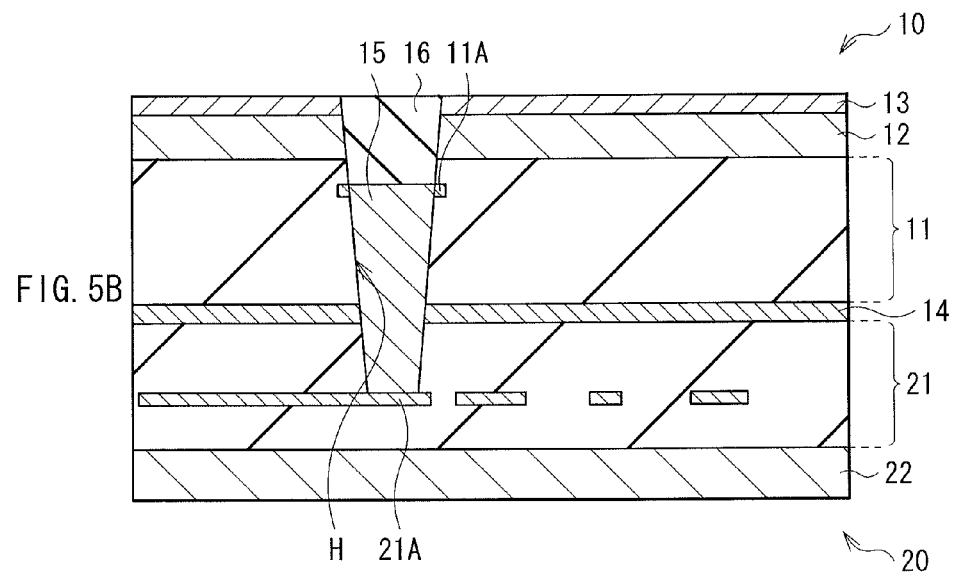

Then, as illustrated in FIG. 5B, the insulating film material formed on the device formation layer 13 is polished, for example, by a chemical mechanical polishing (CMP) process to form the insulating layer 16.

Finally, the protective film 17 including the above-described material is formed, for example, by a CVD process or a sputter process, so that the semiconductor unit 1A illustrated in FIG. 1 is completed.

Advantageous Effects

In the semiconductor unit 1A, the two different types of semiconductor chips (the first chip 10 and the second chip 20) are bonded together and are electrically connected to each other by the through-electrode 15, achieving a device having a configuration where the pixel section 10A and the circuit section 130 are vertically laminated, for example, as described later. In addition, the insulating layer 16 is provided penetrating the semiconductor substrate 12, thereby making it easier to ensure insulation between the semiconductor substrate 12 and the through-electrode 15. In addition, a wiring distance between the first and second wiring layers is reduced, leading to a reduction in wiring capacitance.

Figure 6:
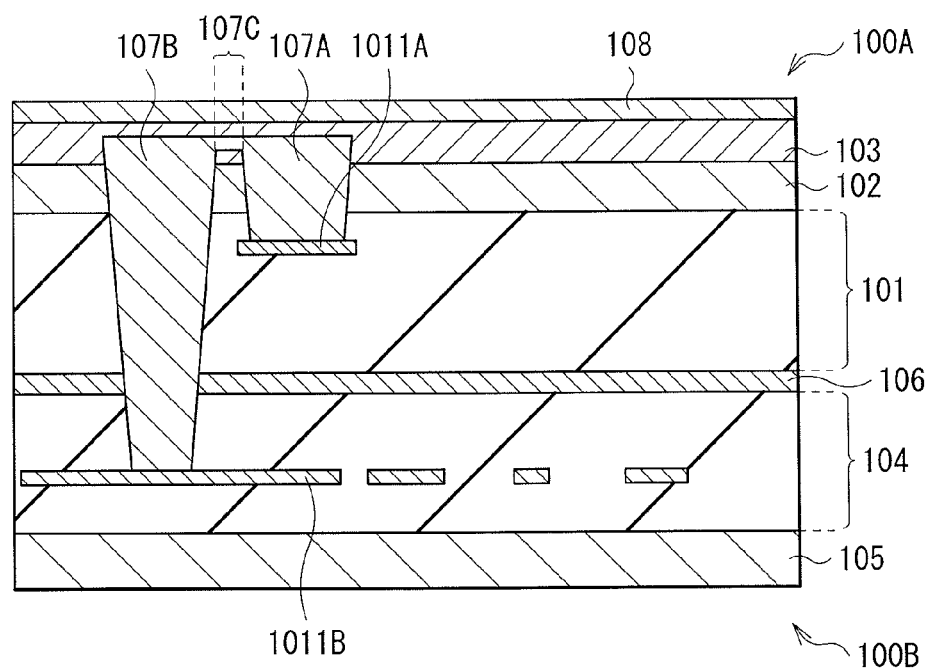
FIG. 6 is a sectional view illustrating a schematic configuration of a semiconductor unit according to a comparative example 1.
Figure 7:
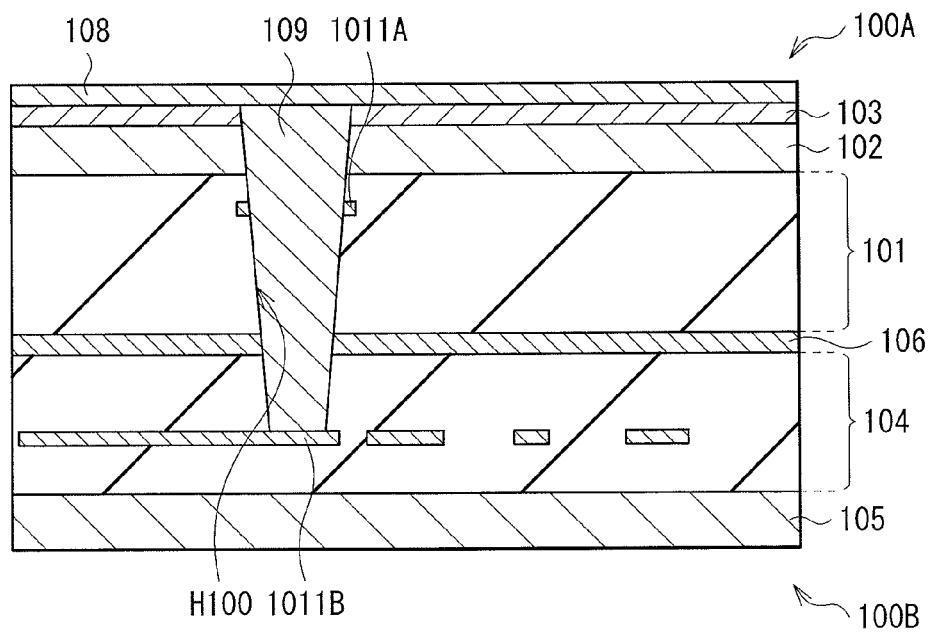
FIG. 7 is a sectional view illustrating a schematic configuration of a semiconductor unit according to a comparative example 2.

Semiconductor units according to comparative examples of the first embodiment are now described. FIG. 6 is a sectional view illustrating a schematic configuration of a semiconductor unit according to comparative example 1. FIG. 7 is a sectional view illustrating a schematic configuration of a semiconductor unit according to comparative example 2. In the comparative example 1, as in the first embodiment, different types of chips, or a first chip 100A and a second chip 100B, are bonded to each other, and a first connection pad 1011A and a second connection pad 1011B provided in multilayer wiring layers 101 and 104, respectively, are electrically connected to each other. In the comparative example 1, however, the first connection pad 1011A is connected to the second connection pad 1011B with two through-electrodes 107A and 107B. The through-electrode 107A is connected to the first connection pad 1011A of the first chip 100A, and the through-electrode 107B is connected to the second connection pad 1011B of the second chip 100B. In the comparative example 2, as in the first embodiment, the first connection pad 1011A is connected to the second connection pad 1011B with one through-electrode 109.

In the comparative examples 1 and 2, any of the through-electrodes 107A, 107B, and 109 is provided penetrating the semiconductor substrate 102. It is therefore difficult to ensure insulation between the through-electrode and the semiconductor substrate 102. In addition, the configuration of the comparative example 1 leads to an increase in wiring distance between the first and the second connection pads 1011A and 1011B, namely, an increase in wiring capacitance. In addition, it is necessary to form an embedded wiring by a damascene process between the through-electrodes 107A and 107B, leading to an increase in number of process steps.

In contrast, in the first embodiment, as described above, while the first connection pad 11A is electrically connected to the second connection pad 21A by the through-electrode 15, a region penetrating the semiconductor substrate 12 is filled with the insulating layer 16. This makes it easier to ensure insulation between the through-electrode 15 and the semiconductor substrate 12. In addition, the distance between the first and the second connection pads 11A and 21A is small compared with that in the comparative example 1, allowing a reduction in wiring capacitance.

In addition, the number of through-electrodes is small compared with that in the comparative example 1, and wiring formation by a damascene process is eliminated, resulting in a simple manufacturing process.

Furthermore, in the comparative examples 1 and 2, any of the through-electrodes 107A, 107B, and 109 penetrates the Si semiconductor substrate 12. Hence, if there is a potential difference (for example, about 0 to 200 V) between the through-electrode and the semiconductor substrate, current leakage occurs between the through-electrode and the semiconductor substrate at a relatively low voltage. In the first embodiment, the through-electrode 15 does not penetrate the semiconductor substrate 12, preventing such a disadvantage (so-called degradation of withstand voltage or insufficient insulation withstand voltage).

In addition, the insulating layer 16 is formed on the through-electrode 15 so as to fill the upper part of the through-hole H. Thus, airtightness of the through-electrode 15 is maintained, and even if the through-electrode 15 is subsequently subjected to a high-temperature process, the through-electrode 15 may not be damaged.

As described hereinbefore, in the first embodiment, the first and second chips 10 and 20 are bonded to each other, in which the first and second connection pads 11A and 21A are electrically connected to each other by the through-electrode 15, and the region penetrating the semiconductor substrate 12 is filled with the insulating layer 16. As a result, while insulation between the semiconductor substrate 12 and the through-electrode 15 is ensured, the wiring capacitance between the first and the second connection pads 11A and 21A is reduced. Consequently, excellent electric connection is ensured between different semiconductor chips (device substrates).

Second Embodiment

Configuration

Figure 8:
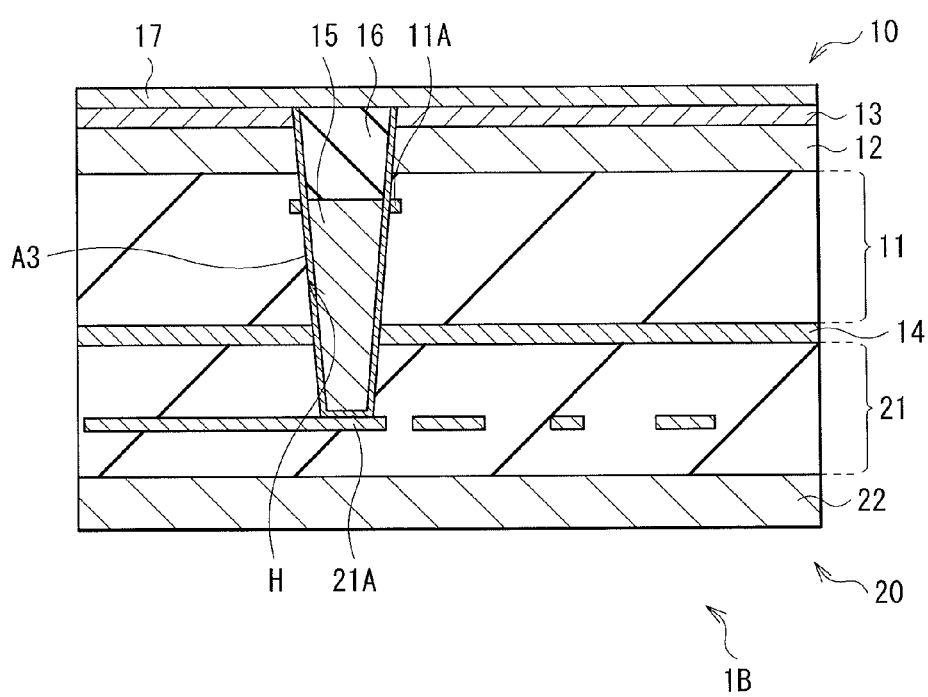
FIG. 8 is a sectional view illustrating a schematic configuration of a semiconductor unit according to a second embodiment of the disclosure.

FIG. 8 illustrates a sectional configuration of a semiconductor unit (semiconductor unit 1B) according to a second embodiment of the disclosure. The semiconductor unit is used in the solid-state image pickup unit 1 described later, as in the semiconductor unit 1A of the first embodiment. In addition, the first and second chips 10 and 20 are bonded to each other, in which while the first connection pad 11A is electrically connected to the second connection pad 21A by the through-electrode 15, the region penetrating the semiconductor substrate 12 on the through-electrode 15 is filled with the insulating layer 16. Furthermore, the protective film 17 is provided over the device formation layer 13 of the first chip 10. It is to be noted that components similar to those in the first embodiment are designated by the same numerals, and description thereof is appropriately omitted.

The semiconductor unit 1B, however, is different from the semiconductor unit of the first embodiment in that the through-electrode 15 is formed by electrolytic plating, and a seed metal layer A3 (metal thin film) is provided over the inner wall surface of the through-hole H and the surface of the second connection pad 21A exposed in the through-hole H.

The seed metal layer A3 is a thin film layer as a seed layer for the electrolytic plating, and is configured of, for example, a laminated film of tantalum (Ta) and copper, a laminated film of titanium (Ti) and copper, or a laminated film of a titanium-tungsten alloy (TiW) and copper. The through-electrode 15 is similar to that in the first embodiment except for the film-formation process, and also includes, for example, nickel or copper. The seed metal layer A3 has a thickness of about 10 nm to 35 nm, for example.

[Manufacturing Method]

The semiconductor unit 1B is manufactured in the following way, for example. Specifically, first, in a manner similar to that of the first embodiment, the first and second chips 10 and 20 are bonded to each other, and then the through-hole H is formed at a position in opposition to each of the first connection pad 11A and the second connection pad 21A.

Then, as illustrated in FIG. 9A, the seed metal layer A3 is deposited over the entire surface of the substrate by a sputter process, for example.

Then, as illustrated in FIG. 9B, electrolytic Ni or Cu plating is performed. In this operation, in the second embodiment, the first connection pad 11A is connected to the second connection pad 21A by the plated Ni or Cu film precipitated by the electrolytic plating, and then the electrolytic plating is stopped before the plated film fills a region corresponding to the semiconductor substrate 12 (preferably, immediately after the first connection pad 11A is connected to the second connection pad 21A). In this way, the through-electrode 15 in the second embodiment is formed through control of a condition (time) of the electrolytic plating.

Then, the insulating layer 16 is formed. Specifically, first, as illustrated in FIG. 10A, the above-described insulating material is formed over the entire surface of the first chip 10 in such a manner as to fill the region on the through-electrode 15 in the through-hole H, as in the first embodiment. Then, as illustrated in FIG. 10B, the insulating film material and the seed metal layer A3 formed on the device formation layer 13 are polished to be removed, for example, by a CMP process to form the insulating layer 16.

Finally, the protective film 17 including the above-described material is formed, for example, by a CVD process or a sputter process, so that the semiconductor unit 1B illustrated in FIG. 8 is completed.

Advantageous Effects

In the semiconductor unit 1B of the second embodiment, as in the semiconductor unit 1A of the first embodiment, the first and second chips 10 and 20 are bonded to each other, in which the first and second connection pads 11A and 21A are electrically connected to each other by the through-electrode 15, and the insulating layer 16 is provided in the region penetrating the semiconductor substrate 12. As a result, while insulation between the semiconductor substrate 12 and the through-electrode 15 is ensured, the wiring capacitance between the first and the second connection pads 11A and 21A is reduced. Consequently, the same advantageous effects as in the first embodiment are achieved. In addition, even if the through-hole H has a large aspect ratio (i.e., depth>diameter), disconnection at a step of the seed metal layer A3 is suppressed, avoiding inferior plating due to such disconnection at a step. Furthermore, the plated film is prevented from being formed on the surface of the first chip 10 through time control of electrolytic plating, making it possible to eliminate the necessity of performing a polishing process of the plated film before forming the protective film 17.

Third Embodiment

Configuration

Figure 11:
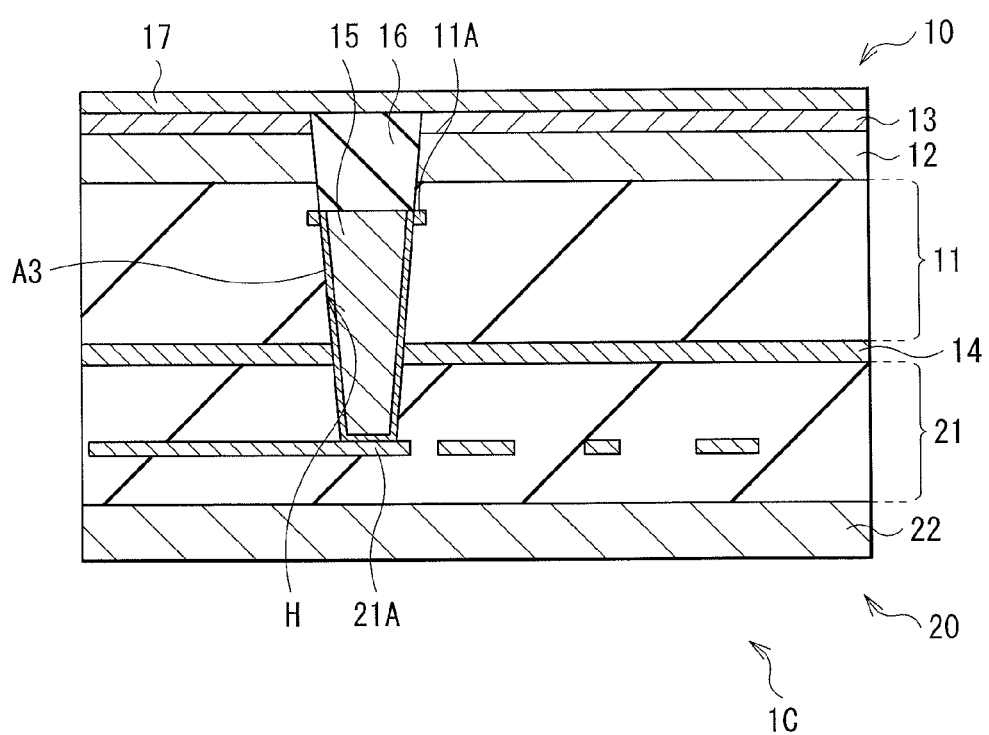
FIG. 11 is a sectional view illustrating a schematic configuration of a semiconductor unit according to a third embodiment of the disclosure.

FIG. 11 illustrates a sectional configuration of a semiconductor unit (semiconductor unit 1C) according to a third embodiment of the disclosure. In the third embodiment, as in the first and second embodiments, the first connection pad 11A is electrically connected to the second connection pad 21A by the through-electrode 15, and the region penetrating the semiconductor substrate 12 on the through-electrode 15 is filled with the insulating layer 16 in the first and second chips 10 and 20. Furthermore, the protective film 17 is provided over the device formation layer 13 of the first chip 10. It is to be noted that components similar to those in the first embodiment are designated by the same numerals, and description thereof is appropriately omitted.

In addition, as in the second embodiment, the through-electrode 15 is formed by electrolytic plating, and the seed metal layer A3 is provided over the inner wall surface of the through-hole H and the surface of the second connection pad 21A exposed in the through-hole H. The third embodiment, however, is different from the second embodiment in that the seed metal layer A3 is formed only on a region opposed to the through-electrode 15 excluding a part, which corresponds to a region opposed to the insulating layer 16, of the inner wall surface of the through-hole H.

[Manufacturing Method]

The semiconductor unit 1C is manufactured in the following way, for example. Specifically, first, in a manner similar to that of the first embodiment, the first and second chips 10 and 20 are bonded to each other, and then the through-hole H is formed at a position in opposition to each of the first connection pad 11A and the second connection pad 21A.

Figure 12A:
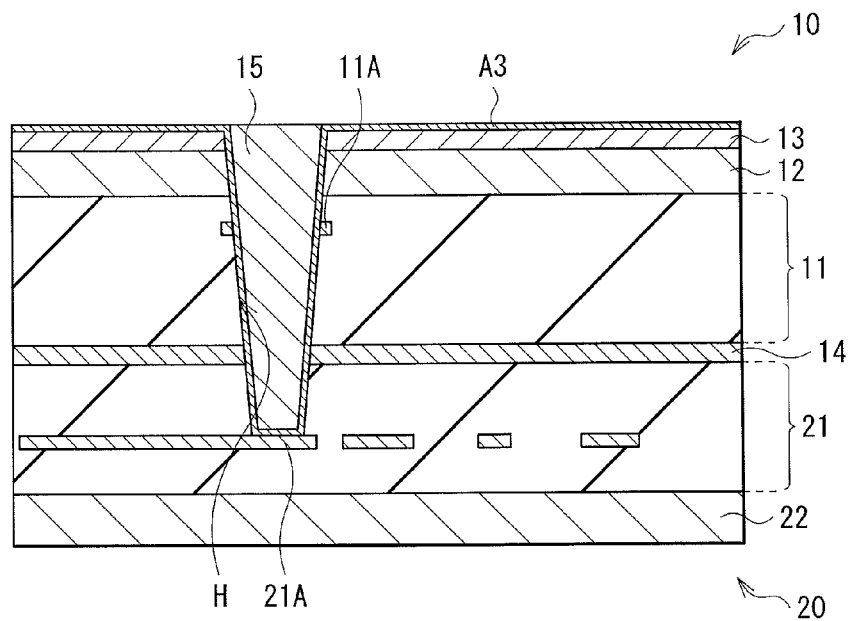
FIGS. 12A and 12B are sectional views for describing a method of manufacturing the semiconductor unit illustrated in FIG. 11.
Figure 12B:
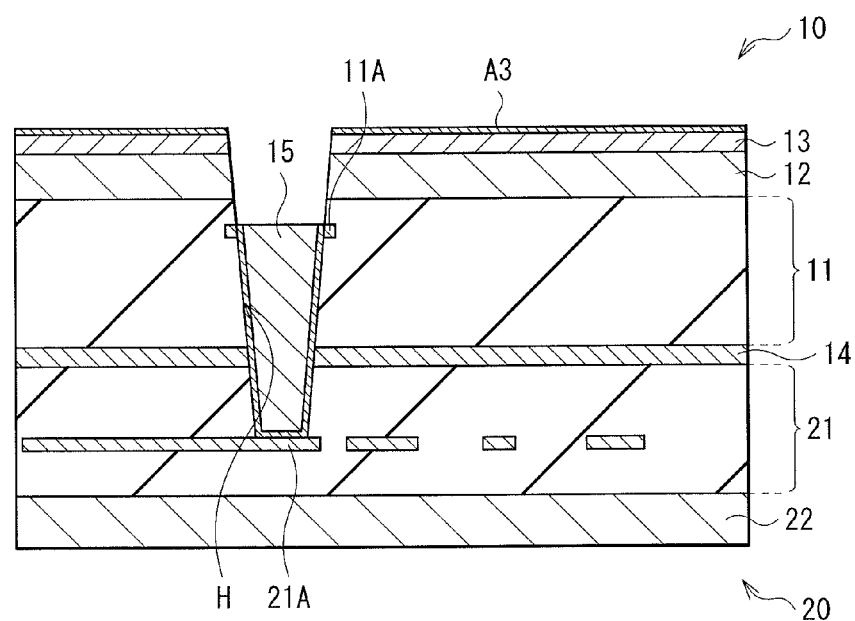

Then, in a manner similar to that of the second embodiment, the seed metal layer A3 is formed over the entire surface of the substrate, and then, as illustrated in FIG. 12A, electrolytic Ni or Cu plating is performed. In this operation, in the third embodiment, the first connection pad 11A is connected to the second connection pad 21A by the plated Ni or Cu film precipitated by the electrolytic plating, and then the electrolytic plating is further continued until the through-hole H is filled. Then, as illustrated in FIG. 12B, the upper part (a region where the insulating layer 16 is to be formed on the first connection pad 11A) of the plated film filled in the through-hole H is selectively removed by etching using a photolithography process, for example. In this operation, a mixed solution (FPM) of hydrofluoric acid (HF), hydrogen peroxide ($H_2O_2$), and pure water ($H_2O$) may be used as an etchant. Part of the seed metal layer A3 is also removed together. In this way, in the third embodiment, the plated film is etched after the electrolytic plating process to form the through-electrode 15.

Then, the insulating layer 16 and the protective film 17 are formed in this order in a manner similar to that in each of the first and second embodiments, so that the semiconductor unit 1C illustrated in FIG. 11 is completed.

Advantageous Effects

In the semiconductor unit 1C of the third embodiment, as in the semiconductor unit 1A of the first embodiment, the first connection pad 11A is electrically connected to the second connection pad 21A by the through-electrode 15, and the insulating layer 16 is provided in the region penetrating the semiconductor substrate 12 on the through-electrode 15 in the first and second chips 10 and 20. As a result, while insulation between the semiconductor substrate 12 and the through-electrode 15 is ensured, the wiring capacitance between the first and the second connection pads 11A and 21A is reduced. Consequently, the same advantageous effects as in the first embodiment are achieved. In addition, as in the second embodiment, even if the through-hole H has a large aspect ratio, inferior plating due to disconnection at a step of the seed metal layer A3 is avoided. Furthermore, inferior filling due to a variation in diameter of the through-electrode 15 is avoided.

Application Example 1

Figure 13:
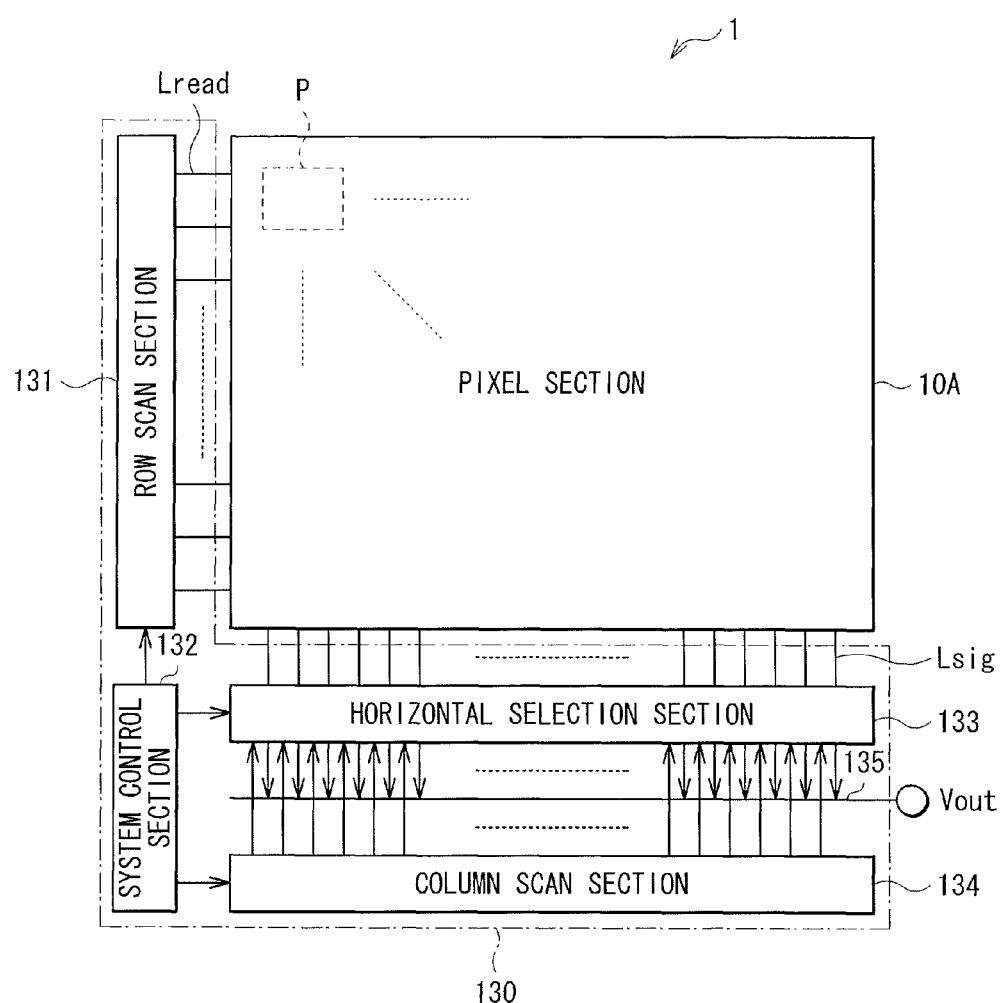
FIG. 13 is a functional block diagram of a solid-state image pickup unit according to application example 1.

FIG. 13 illustrates an overall configuration of a solid-state image pickup unit (solid-state image pickup unit 1) to which any one of the semiconductor units 1A to 1C described in the first to third embodiments is applied. The solid-state image pickup unit 1 is, for example, a CMOS image sensor that includes a pixel section 10A as an image pickup area, and a circuit section 130 including, for example, a row scan section 131, a horizontal selection section 133, a column scan section 134, and a system control section 132.

Figure 14:
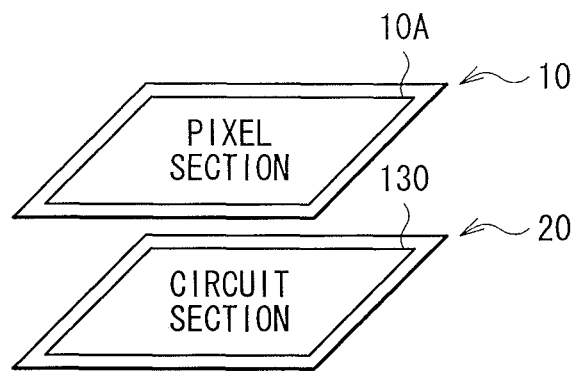
FIG. 14 is a schematic diagram for describing a layout of each of a pixel section and a circuit section illustrated in FIG. 13.

In the application example 1, as illustrated in FIG. 14, for example, the pixel section 10A is provided in the first chip 10 (the device formation layer 13) of each of the semiconductor units 1A to 1C, and the circuit section 130 is provided in the second chip 20 thereof. The system control section 132, which is not illustrated, of the circuit section 130 may be provided in the first chip 10 together with the pixel section 10A.

The pixel section 10A includes a plurality of unit pixels P that are two-dimensionally arranged in a matrix, for example. For example, the unit pixels P are connected to pixel drive lines Lread (in detail, row selection lines and reset control lines) for each of pixel rows, and connected to vertical signal lines Lsig for each of pixel columns. Each pixel drive line Lread transmits a drive signal to read a signal from a pixel. One end of the pixel drive line Lread is connected to an output end corresponding to each row of the row scan section 131.

The row scan section 131 is configured of components such as a shift register and an address decoder, and serves as a pixel drive section that drives the pixels P in the pixel section 10A in rows, for example. Each of signals, which are output from the pixels P in a pixel row selectively scanned by the row scan section 131, is supplied to the horizontal selection section 133 through each vertical signal line Lsig. The horizontal selection section 133 is configured of components such as an amplifier and a horizontal selection switch provided for each vertical signal line Lsig.

The column scan section 134 is configured of components such as a shift register and an address decoder, and scans to sequentially drive the horizontal selection switches of the horizontal selection section 133. Through such selective scan by the column scan section 134, a signal for each pixel, which is transmitted through each vertical signal line Lsig, is sequentially output to each horizontal signal line 19, and is then transmitted to an external unit through the horizontal signal line 19.

The system control section 132 receives a clock from an external unit, data instructing an operation mode, and other signals, and outputs data such as internal information of a solid-state image pickup unit 1. The system control section 132 further includes a timing generator that generates various timing signals, and performs drive control of circuit sections such as the row scan section 131, the horizontal selection section 133, and the column scan section 134 based on the various timing signals generated by the timing generator.

Application Example 2

Figure 15:
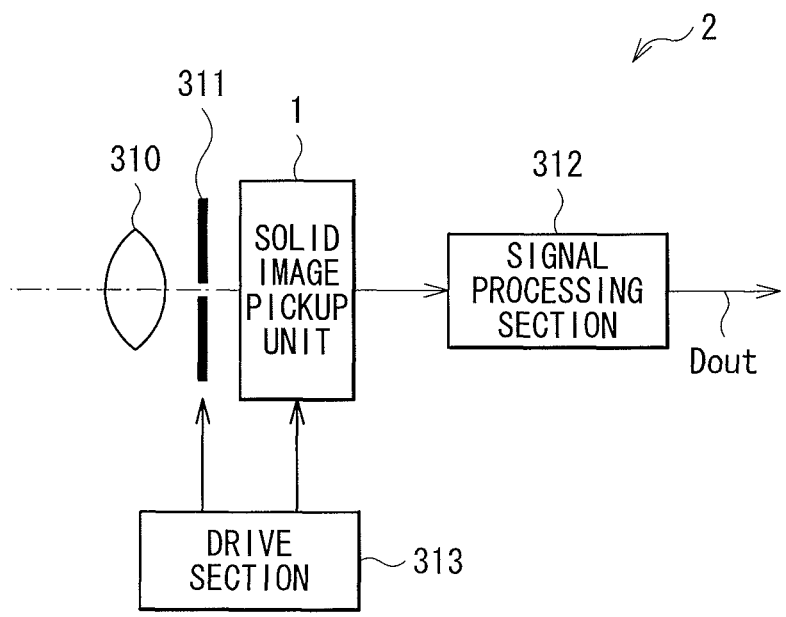
FIG. 15 is a block diagram illustrating a schematic configuration of an electronic apparatus (camera) according to application example 2.

The above-described solid-state image pickup unit 1 may be applied to any type of electronic apparatuses having an image pickup function, for example, a camera system such as a digital still camera and a video camcorder, and a mobile phone having an image pickup function. FIG. 15 illustrates a schematic configuration of an electronic apparatus 2 (camera) as an example of the electronic apparatus. The electronic apparatus 2 is, for example, a video camcorder that may take a still or moving image, and has the solid-state image pickup unit 1, an optical system (optical lens) 310, a shutter unit 311, a drive section 313 that drives the solid-state image pickup unit 1 and the shutter unit 311, and a signal processing section 312.

The optical system 310 guides image light (incident light) from a subject to the pixel section 10A of the solid-state image pickup unit 1. The optical system 310 may be configured of a plurality of optical lenses. The shutter unit 311 controls an application/blocking period of light to the solid-state image pickup unit 1. The drive section 313 controls transfer operation of the solid-state image pickup unit 1 and shutter operation of the shutter unit 311. The signal processing section 312 performs various types of signal processing to the signal output from the solid-state image pickup unit 1. An image signal Dout subjected to the signal processing is stored in a storage medium such as a memory, or output to a display, for example.

Although the technology has been described with the example embodiments and the application examples, the contents of the disclosure are not limited thereto, and various modifications or alterations thereof may be made. For example, although the example embodiments and the application examples have been described with a case where two (two types of) semiconductor chips are bonded to each other, three or more semiconductor chips may be bonded (laminated) to one another. In such a case as well, the through-electrode is provided to electrically connect the connection pads of the chips to each other, and the insulating layer is provided penetrating one semiconductor substrate on a surface side, achieving the advantageous effects of the contents of the example embodiments of the disclosure.

Although the example embodiments and the application examples have been exemplified with a configuration of a solid-state image pickup unit of a back-side illumination type, the contents of the disclosure are applicable to a solid-state image pickup unit of a front-side illumination type.

In addition, each of the semiconductor unit and the solid-state image pickup unit according to the disclosure may not include all the components described in the above example embodiments and the application examples, or may further include another layer.

Accordingly, it is possible to achieve at least the following configurations from the above-described example embodiments, the modifications, and the application examples of the disclosure.

(1) A semiconductor unit, including:

a first device substrate including a first semiconductor substrate and a first wiring layer, the first wiring layer being provided on one surface side of the first semiconductor substrate;

a second device substrate including a second semiconductor substrate and a second wiring layer, the second device substrate being bonded to the first device substrate, and the second wiring layer being provided on one surface side of the second semiconductor substrate;

a through-electrode penetrating the first device substrate and a part or all of the second device substrate, and electrically connecting the first wiring layer and the second wiring layer to each other; and an insulating layer provided in opposition to the through-electrode, and penetrating one of the first semiconductor substrate and the second semiconductor substrate.

(2) The semiconductor unit according to (1), wherein
the first device substrate is laminated on the second device substrate,
the through-electrode fills a region between the first wiring layer and the second wiring layer in a through-hole, the through-hole penetrating from a surface of the first device substrate up to a surface of the second wiring layer through the first semiconductor substrate and the first wiring layer in this order, and
the insulating layer fills a region on the through-electrode in the through-hole.

(3) The semiconductor unit according to (2), wherein the first wiring layer is apertured as an opening that configures a part of the through-hole.

(4) The semiconductor unit according to (2) or (3), wherein an inner wall of the through-hole is entirely covered with a metal thin film.

(5) The semiconductor unit according to (2) or (3), wherein, of an inner wall of the through-hole, only a region opposed to the through-electrode is covered with a metal thin film.

(6) The semiconductor unit according to any one of (1) to (5), wherein the through-electrode includes one of copper and nickel.

(7) The semiconductor unit according to any one of (1) to (6), wherein the insulating layer includes one of a silicon oxide film and a photosensitive resin.

(8) The semiconductor unit according to any one of (2) to (7), further including a protective film provided on the first device substrate.

(9) A method of manufacturing a semiconductor unit, the method including:
bonding a first device substrate to a second device substrate, the first device substrate including a first semiconductor substrate and a first wiring layer, the first wiring layer being provided on one surface side of the first semiconductor substrate, the second device substrate including a second semiconductor substrate and a second wiring layer, and the second wiring layer being provided on one surface side of the second semiconductor substrate;
forming a through-electrode, the through-electrode penetrating the first device substrate and a part or all of the second device substrate and electrically connecting the first wiring layer and the second wiring layer to each other; and
forming an insulating layer, the insulating layer being formed in opposition to the through-electrode and penetrating one of the first semiconductor substrate and the second semiconductor substrate.

(10) The method of manufacturing the semiconductor unit according to (9), further including forming, after the bonding the first device substrate to the second device substrate, a through-hole penetrating from a surface of the first device substrate up to a surface of the second wiring layer through the first semiconductor substrate and the first wiring layer in this order,
wherein the forming the through-electrode includes filling a region between the first wiring layer and the second wiring layer in the formed through-hole, and
the forming the insulating layer includes filling, after the forming the through-electrode, a region on the through-electrode in the through-hole.

(11) The method of manufacturing the semiconductor unit according to (9) or (10), wherein the forming the through-electrode includes performing electroless plating to form the through-electrode.

(12) The method of manufacturing the semiconductor unit according to (10) or (11), wherein the forming the insulating layer includes:
forming, after the forming the through-electrode and the filling the region on the through-electrode in the through-hole, a film of an insulating material over the first device substrate; and
polishing, after the forming the film of the insulating material, the film of the insulating material.

(13) The method of manufacturing the semiconductor unit according to (9) or (10), wherein the forming the through-electrode includes performing electrolytic plating to form the through-electrode.

(14) The method of manufacturing the semiconductor unit according to (13), wherein the forming the through-electrode includes stopping the performing the electrolytic plating after the first wiring layer and the second wiring layer are connected to each other by a plating film precipitated in the through-hole but before the through-hole is filled by the plating film.

(15) The method of manufacturing the semiconductor unit according to (13), wherein the forming the through-electrode includes removing selectively, after a plating film is precipitated in the through-hole, a region on the first wiring layer of the plating film.

(16) The method of manufacturing the semiconductor unit according to any one of (9) to (15), wherein the through-electrode includes one of copper and nickel.

(17) The method of manufacturing the semiconductor unit according to any one of (9) to (16), wherein the insulating layer includes one of a silicon oxide film and a photosensitive resin.

(18) A solid-state image pickup unit with a semiconductor unit, the semiconductor unit including:
a first device substrate including a first semiconductor substrate and a first wiring layer, the first wiring layer being provided on one surface side of the first semiconductor substrate;
a second device substrate including a second semiconductor substrate and a second wiring layer, the second device substrate being bonded to the first device substrate, and the second wiring layer being provided on one surface side of the second semiconductor substrate;
a through-electrode penetrating the first device substrate and a part or all of the second device substrate, and electrically connecting the first wiring layer and the second wiring layer to each other; and
an insulating layer provided in opposition to the through-electrode, and penetrating one of the first semiconductor substrate and the second semiconductor substrate.

(19) The solid-state image pickup unit according to (18), wherein
the first device substrate includes a pixel section, the pixel section including a photoelectric conversion device as a pixel, and
the second device substrate includes a circuit section that drives the pixel section.

(20) An electronic apparatus with a solid-state image pickup unit, the solid-state image pickup unit being provided with a semiconductor unit, the semiconductor unit including:
a first device substrate including a first semiconductor substrate and a first wiring layer, the first wiring layer being provided on one surface side of the first semiconductor substrate;
a second device substrate including a second semiconductor substrate and a second wiring layer, the second device substrate being bonded to the first device substrate, and the second wiring layer being provided on one surface side of the second semiconductor substrate;
a through-electrode penetrating the first device substrate and a part or all of the second device substrate, and electrically connecting the first wiring layer and the second wiring layer to each other; and
an insulating layer provided in opposition to the through-electrode, and penetrating one of the first semiconductor substrate and the second semiconductor substrate.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor unit, comprising:
   a first device substrate including a first semiconductor substrate and a first wiring layer, wherein the first wiring layer is on one surface side of the first semiconductor substrate;
   a second device substrate including a second semiconductor substrate and a second wiring layer, wherein the second device substrate is bonded to the first device substrate, and wherein the second wiring layer is on one surface side of the second semiconductor substrate;
   a through-electrode that penetrates the first device substrate and a part of the second device substrate in a through-hole, and electrically connects the first wiring layer and the second wiring layer to each other; and
   an insulating layer, on top of the through-electrode in the through-hole, penetrates a part of the first device substrate.

2. The semiconductor unit according to claim 1, wherein the first device substrate is laminated on the second device substrate,
   the through-electrode fills a first region between the first wiring layer and the second wiring layer in the through-hole, wherein the through-hole penetrates from a surface of the first device substrate up to a surface of the second wiring layer through the first semiconductor substrate and the first wiring layer, and
   the insulating layer fills a second region on top of the through-electrode in the through-hole.

3. The semiconductor unit according to claim 2, wherein the first wiring layer is apertured as an opening that configures a part of the through-hole.

4. The semiconductor unit according to claim 2, wherein an inner wall of the through-hole is entirely covered with a metal thin film.

5. The semiconductor unit according to claim 2, wherein, of an inner wall of the through-hole, only a third region opposed to the through-electrode is covered with a metal thin film.

6. The semiconductor unit according to claim 1, wherein the through-electrode includes at least one of copper or nickel.

7. The semiconductor unit according to claim 1, wherein the insulating layer comprises at least one of a silicon oxide film or a photosensitive resin.

8. The semiconductor unit according to claim 2, further comprising a protective film on the first device substrate.

9. A method of manufacturing a semiconductor unit, the method comprising:
   bonding a first device substrate to a second device substrate, the first device substrate including a first semiconductor substrate and a first wiring layer, wherein the first wiring layer is on one surface side of the first semiconductor substrate, the second device substrate including a second semiconductor substrate and a second wiring layer, and wherein the second wiring layer is on one surface side of the second semiconductor substrate;
   forming a through-electrode, the through-electrode penetrating the first device substrate and a part of the second device substrate in a through-hole, and electrically connecting the first wiring layer and the second wiring layer to each other; and
   forming an insulating layer, the insulating layer being formed on the through-electrode in the through-hole and penetrating a part of the first device substrate.

10. A method of manufacturing a semiconductor unit, the method comprising:
    bonding a first device substrate to a second device substrate, the first device substrate including a first semiconductor substrate and a first wiring layer, wherein the first wiring layer is on one surface side of the first semiconductor substrate, the second device substrate including a second semiconductor substrate and a second wiring layer, and wherein the second wiring layer is on one surface side of the second semiconductor substrate;
    forming, after the bonding the first device substrate to the second device substrate, a through-hole penetrating from a surface of the first device substrate up to a surface of the second wiring layer through the first semiconductor substrate and the first wiring layer,
    forming a through-electrode, the through-electrode penetrating the first device substrate and a part of the second device substrate, and electrically connecting the first wiring layer and the second wiring layer to each other; and
    forming an insulating layer, the insulating layer being formed in opposition to the through-electrode and penetrating a part of the first device substrate,
       wherein the forming the through-electrode includes filling a first region between the first wiring layer and the second wiring layer in the formed through-hole, and
       the forming the insulating layer includes filling, after the forming the through-electrode, a second region on the through-electrode in the through-hole.

11. The method of manufacturing the semiconductor unit according to claim 10, wherein the forming the through-electrode includes electroless plating to form the through-electrode.

12. The method of manufacturing the semiconductor unit according to claim 10, wherein the forming the insulating layer includes:
    forming, after the forming the through-electrode and the filling the second region on the through-electrode in the through-hole, a film of an insulating material over the first device substrate; and
    polishing, after the forming the film of the insulating material, the film of the insulating material.

13. The method of manufacturing the semiconductor unit according to claim 10, wherein the forming the through-electrode includes electrolytic plating to form the through-electrode.

14. The method of manufacturing the semiconductor unit according to claim 13, wherein the forming the through-electrode includes stopping the electrolytic plating after the first wiring layer and the second wiring layer are connected to each other by a plating film precipitated in the through-hole but before the through-hole is filled by the plating film.

15. The method of manufacturing the semiconductor unit according to claim 13, wherein the forming the through-electrode includes removing selectively, after a plating film is precipitated in the through-hole, a region on the first wiring layer of the plating film.

16. The method of manufacturing the semiconductor unit according to claim 9, wherein the through-electrode includes at least one of copper or nickel.

17. The method of manufacturing the semiconductor unit according to claim 9, wherein the insulating layer comprises at least one of a silicon oxide film or a photosensitive resin.

18. A solid-state image pickup unit with a semiconductor unit, the semiconductor unit comprising:
   a first device substrate including a first semiconductor substrate and a first wiring layer, wherein the first wiring layer is on one surface side of the first semiconductor substrate;
   a second device substrate including a second semiconductor substrate and a second wiring layer, wherein the second device substrate is bonded to the first device substrate, and wherein the second wiring layer is on one surface side of the second semiconductor substrate;
   a through-electrode that penetrates the first device substrate and a part of the second device substrate in a through-hole, and electrically connects the first wiring layer and the second wiring layer to each other; and
   an insulating layer, on top of the through-electrode in the through-hole, penetrates a part of the first device substrate.

19. The solid-state image pickup unit according to claim 18, wherein the first device substrate includes a pixel section, the pixel section including a photoelectric conversion device as a pixel, and the second device substrate includes a circuit section that drives the pixel section.

20. An electronic apparatus with a solid-state image pickup unit, the solid-state image pickup unit is with a semiconductor unit, the semiconductor unit comprising:
   a first device substrate including a first semiconductor substrate and a first wiring layer, wherein the first wiring layer is on one surface side of the first semiconductor substrate;
   a second device substrate including a second semiconductor substrate and a second wiring layer, wherein the second device substrate is bonded to the first device substrate, and wherein the second wiring layer is on one surface side of the second semiconductor substrate;
   a through-electrode that penetrates the first device substrate and a part of the second device substrate in a through-hole, and electrically connects the first wiring layer and the second wiring layer to each other; and
   an insulating layer, on top of the through-electrode in the through-hole, penetrates a part of the first device substrate.

* * * * *